(12) United States Patent
Laurent et al.

(10) Patent No.: US 8,829,506 B2
(45) Date of Patent: Sep. 9, 2014

(54) OPTOELECTRONIC DEVICE HAVING AN EMBEDDED ELECTRODE

(75) Inventors: Jean-Yves Laurent, Domene (FR); Jean-Marie Verilhac, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/699,954

(22) PCT Filed: May 24, 2011

(86) PCT No.: PCT/FR2011/000311
§ 371 (c)(1),
(2), (4) Date: Nov. 26, 2012

(87) PCT Pub. No.: WO2011/148064
PCT Pub. Date: Dec. 1, 2011

(65) Prior Publication Data
US 2013/0069050 A1    Mar. 21, 2013

(30) Foreign Application Priority Data

May 28, 2010    (FR) .................................... 10 02271

(51) Int. Cl.
| | |
|---|---|
| H01L 35/24 | (2006.01) |
| H01L 51/42 | (2006.01) |
| H01L 51/44 | (2006.01) |
| H01L 51/50 | (2006.01) |
| H01L 51/52 | (2006.01) |

(52) U.S. Cl.
CPC ............ *H01L 51/5088* (2013.01); *H01L 51/42* (2013.01); *H01L 51/441* (2013.01); *H01L 51/50* (2013.01); *H01L 51/5203* (2013.01); *H01L 51/5221* (2013.01); *Y02E 10/549* (2013.01)
USPC ......................... 257/40; 438/99; 257/E25.032

(58) Field of Classification Search
CPC ..................... H01L 51/0545; H01L 51/0541
USPC ................... 257/40, 642, E25.032, E51.022; 438/82, 99
See application file for complete search history.

(56) References Cited

U.S. PATENT DOCUMENTS

| | | | |
|---|---|---|---|
| 2006/0152147 | A1 | 7/2006 | Lee et al. |
| 2010/0207112 | A1 | 8/2010 | Furst et al. |
| 2010/0314611 | A1* | 12/2010 | Murata et al. .................... 257/40 |

FOREIGN PATENT DOCUMENTS

| | | |
|---|---|---|
| DE | 10 2007 046 444 A1 | 4/2009 |
| WO | WO 2011/103952 A1 | 9/2011 |

OTHER PUBLICATIONS

Mathijssen et al. "Manipulating the Local Light Emission in Organic Light-Emitting Diodes by using Patterned Self-Assembled Monolayers," *Advanced Materials*, vol. 20, No. 14, pp. 2703-2706, 2008.
Aug. 31, 2011 International Search Report issued in Application No. PCT/FR2011/000311 (with translation).
Jan. 3, 2014 Office Action issued in European Patent Application No. 11 728 310.1.

\* cited by examiner

*Primary Examiner* — Quoc Hoang
(74) *Attorney, Agent, or Firm* — Oliff PLC

(57) ABSTRACT

An optoelectronic device including a first electrode arranged on a substrate, a second electrode that includes a first surface facing the first electrode, and a semiconductor material layer that is in electric contact with the first and second electrodes. The second electrode includes a side wall that is adjacent to the first surface and is covered with the semiconductor material layer by the insertion of a self-assembled monolayer.

19 Claims, 4 Drawing Sheets ated monolayer (SAM). Self-assembled monolayers, for example
OPTOELECTRONIC DEVICE HAVING AN EMBEDDED ELECTRODE

BACKGROUND OF THE INVENTION

The invention relates to a diode-type optoelectronic device using a semiconductor material.

State of the art

FIG. 1 schematically shows a conventional organic light-emitting diode (OLED) architecture. Such a diode comprises a stack of thin layers on a transparent glass substrate 1. The stack generally comprises a first electrode to 2 (anode), a hole injection and transport layer 3, an organic semiconductor material layer 4, and a second electrode 5 (cathode).

Thus, in such a configuration, said to be vertical, electrodes 2 and 5 are placed on either side of layer 4, which has a thickness of approximately 150 nm.

Electrode 2, on the substrate side, is generally made of indium tin oxide (ITO). ITO is a hole conductor and is transparent to the radiation emitted from organic layer 4. Layer 3, called injection layer, which is also transparent to the emission wavelength, promotes the injection of holes from the anode to the organic material and blocks electrons. It is conventionally formed by a conductive polymer, triarylamine or PEDOT-PSS (poly(3,4-ethylenedioxythiophene)-poly(styrene sulfonate)). The material of layer 4 is a semiconductor polymer such as poly(para-phenylene vinylene) (PPV).

The optoelectronic performance of an OLED especially depends on the injection of carriers into organic layer 4. The injection of electrons, from cathode 5 to layer 4, is made easier by the selection of an electrode material having a work function which coincides with the lower unoccupied molecular orbital (LUMO) of the organic material.

The materials used as a cathode and fulfilling this criterion are calcium (Ca), barium (Ba), cesium (Cs), aluminum (Al), and lithium fluoride (LiF). However, such materials are easily oxidizable and have a high instability regarding oxygen and/or water.

Such materials, which are difficult to use, tend to be replaced with materials less sensitive to oxygen (Au, Pd, Pt, Cu, Ag . . . ). However, these metals have a work function which is does not coincide with the LUMO energy level.

The work function of such metals is then adjusted to the LUMO level of the organic material via a self-assembled monolayer (SAM). Self-assembled monolayers, for example of thiolated molecule type, enable to increase or to decrease the work function of the electrodes by an energy ranging between a few tenths of electron-volt and several electron-volts. It is thus desired to arrange the SAM layer between organic layer 4 and electrode 5, which raises a number of issues.

On the anode side, there also is a mismatch between materials. In this case, the SAM will be selected to adapt the work function of the anode to the highest occupied molecular orbital (HOMO) level of the organic material.

The fabrication of a vertical diode conventionally comprises the deposition of electrode 2 on substrate 1, the deposition of organic active layer 4, and the deposition of electrode 5 on layer 4.

"Organic materials" designates totally organic materials or composite materials based on inorganic materials and on organic materials, for example in the form of particles.

Electrode 5 is deposited on layer 4 by vacuum evaporation techniques. The technique used is a slow and low-energy method of evaporation using Joule effect, compatible with organic layer 4.

Electrode 5 is generally located on layer 4 by means of a mask through which the metal deposition is performed according to the stencil technique.

The integration of a SAM layer in a diode stack such as shown in FIG. 1 is difficult. Indeed, since the SAM layer is to be grafted on the electrode material, it cannot be deposited on the organic material before the deposition of the electrode metal.

FIG. 2 shows a technique for integrating the SAM layer. It comprises depositing electrode 5 on an additional support 6 made of polydimethylsiloxane (PDMS), and then grafting SAM layer 7 on electrode 5. Support 6 is then laminated on substrate 1 which comprises electrode 2 and organic material 4. Such a lamination operation is difficult to implement and the contact between electrode 5 covered with SAM 7 and organic layer 4 is incomplete, thus causing electric injection problems. Indeed, it is difficult to ensure a bonding between the two co-laminated layers without disturbing the electric properties of the device.

SUMMARY OF THE INVENTION

The invention aims at a high-performance and easy-to-form optoelectronic device.

According to the invention, this aim is achieved by the fact that the device comprises a first electrode arranged on a substrate, a second electrode comprising a first surface facing the first electrode, and a layer of a semiconductor material in electric contact with the first and second electrodes. The second electrode comprises a side wall, adjacent to the first surface, covered with the semiconductor material layer by the insertion of a self-assembled monolayer.

To decrease leakage currents in the device, it is provided to cover the first surface with an electrically insulating layer.

A method for producing an optoelectronic device is further provided. The method is easy to implement and enables to reliably integrate a self-assembled monolayer at the upper electrode level.

The method successively comprises the steps of forming a first electrode on a substrate, forming a separation layer, forming a second electrode on the separation layer, so that the second electrode has a side wall which is offset from an edge of the device, depositing a self-assembled monolayer on the side wall of the second electrode, and depositing a semiconductor material in contact with the first electrode and the self-assembled monolayer.

To avoid altering the semiconductor material during formation of the upper electrode, an electrically insulating material is deposited during formation of the separation layer.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED
EMBODIMENT OF THE INVENTION

Figure 3:
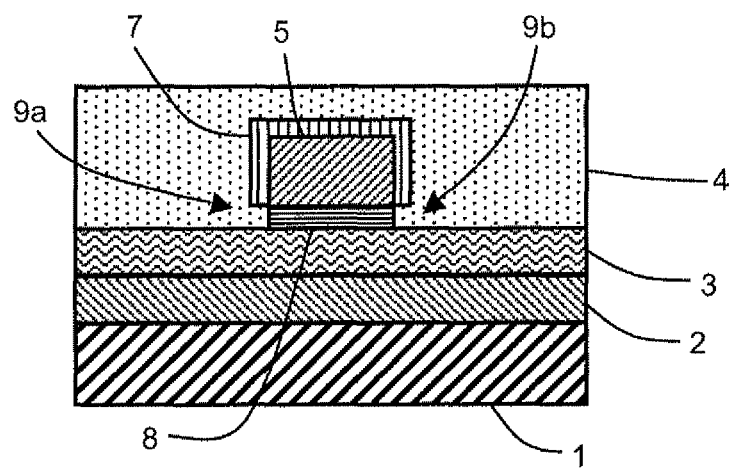
FIG. 3 shows a cross-section view of an embodiment of an optoelectronic device with an embedded electrode according to the present invention.

FIG. 3 shows an embodiment of an optoelectronic device having an embedded electrode.

The device comprises a first electrode 2 arranged on a substrate 1. The first electrode is preferably provided with a charge injection and transport layer 3.

The device also comprises a second electrode 5 arranged in front of the first electrode. Electrode 5 has a compact shape, and is located at the center of the device. Electrode 5 is located above electrode 2 and substrate 1 and is insulated from electrode 2 by a separation area 8.

A layer 4 made from an organic semiconductor material is arranged in electric contact with electrode 2, via injection layer 3, for example.

As mentioned previously, given the nature of electrode 5, the contact between electrode 5 and organic material 4 should be established by insertion of a SAM layer 7. Since layer 7 cannot be arranged on the lower surface of electrode 5 for reliability reasons, it is arranged on the other surfaces of electrode 5. Then, electrode 5 is coated with organic material 4.

Thus, electrode 5 comprises a first surface parallel to electrode 2 in contact with separation area 8 and at least one second surface, adjacent to the first surface, is covered with a self-assembled monolayer (SAM) 7 and with material 4.

In this embodiment, the separation area is formed by an electrically insulating layer 8 to avoid a short-circuit between electrodes 2 and 5. Layer 8 is preferably provided to have the lateral dimensions of electrode 5.

As shown in FIG. 3, electrode 5 is preferably embedded in organic material 4. Its lateral and upper surfaces are totally covered with monolayer 7 and material 4. The lateral surfaces are substantially perpendicular to the first surface of electrode 5.

The device of FIG. 3 may be used as a light-emitting device or as a light-receiving device. The device for example is an organic light-emitting diode (OLED), a solar cell, or an organic photodetector.

In the case of an OLED, the injection of charge carriers into organic layer 4 is mainly performed at the level of the lateral surfaces of electrode 5, via SAM layer 7. The electron and hole recombination rate is the highest in areas 9a and 9b of organic layer 4 located close to electrodes 2 and 5.

Figure 4:
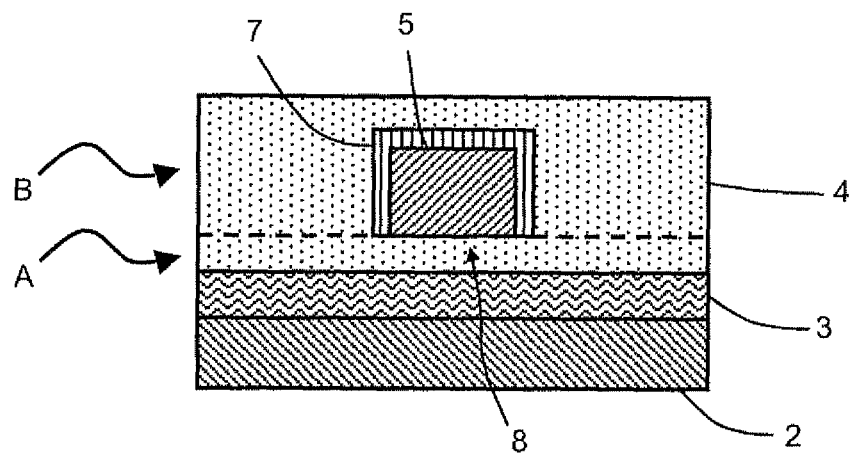
FIGS. 4 and 5 show alternative embodiments of the device of FIG. 3.

FIG. 4 shows an alternative embodiment in which separation area 8 is formed by organic material 4 itself. Electrode 5 is then coated with organic material 4 like an embedded electrode. The lateral and upper surfaces of electrode 5, covered with a SAM, form a better electric contact with material 4 than the lower surface. Indeed, due to layer 7, the work function of the electrode material is close to the LUMO level of the organic material, which decreases the contact resistance. The charge carriers are then preferentially injected through the surfaces covered with the SAM.

In another embodiment, layer 4 may be formed of at least two sub-layers of different semiconductor materials, noted A and B in FIG. 4. For example, in the case of polymer light-emitting diodes (PLED), semiconductor material A may be used as an electron-blocking layer (or hole-blocking layer if the upper electrode is the anode), to increase the efficiency of the device.

In the case of a photodetector, semiconductor material A in contact with layer 3 may be an electron acceptor material (type p) and semiconductor material B in contact with layer 7 may be an electron donor material (type n) (or conversely, according to the nature of the electrodes). This configuration will make it possible to illuminate the photodetector from the top and no longer from the substrate, which is usually difficult to achieve. This structure of layer 4 may be used in combination with the different embodiments of the optoelectronic device.

Layer 4 may also be formed by a mixture of a p-type semiconductor and of an n-type semiconductor to form a bulk heterojunction. A p-type polymer material may for example be mixed with nanoparticles of an n-type inorganic material, such as ZnO.

Figure 1:
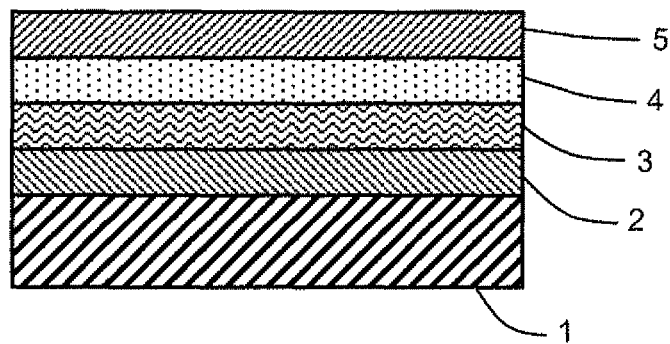
FIG. 1 shows a cross-section view of an organic light-emitting diode (OLED) according to prior art.
Figure 2:
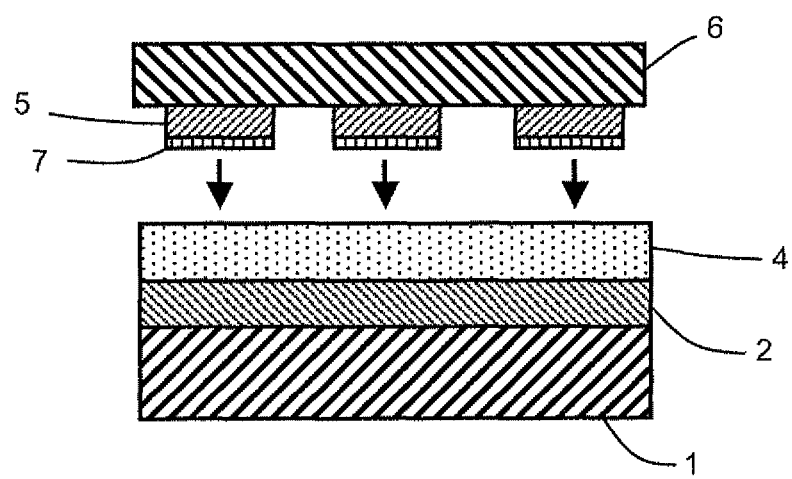
FIG. 2 shows a step of forming a SAM layer in a prior art OLED.
Figure 5:
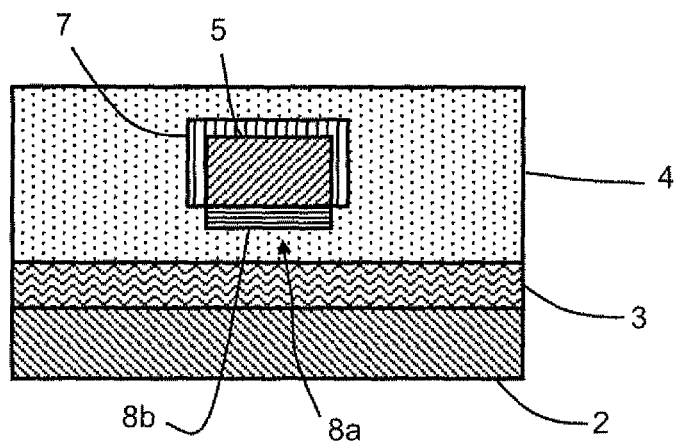

FIG. 5 shows a cross-section view of a preferred embodiment of an opto-electronic device. The separation area comprises two stacked layers 8a and 8b. Layer 8a, formed by organic material 4, is in contact with layer 3 and layer 8b, which is electrically insulating, is in contact with electrode 5. As in the case of FIG. 2, the current is only injected via SAM layer 7.

Figure 6:
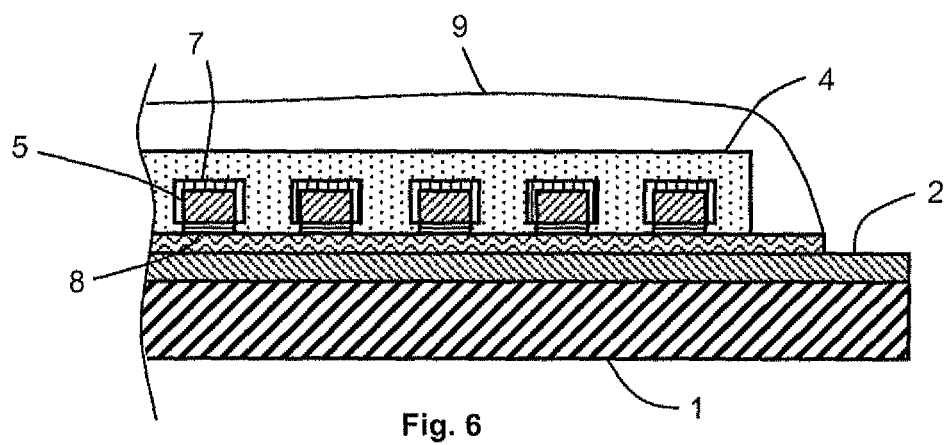
FIG. 6 shows, in simplified cross-section view, an optoelectronic device having a grid-shaped upper electrode.
Figure 7:
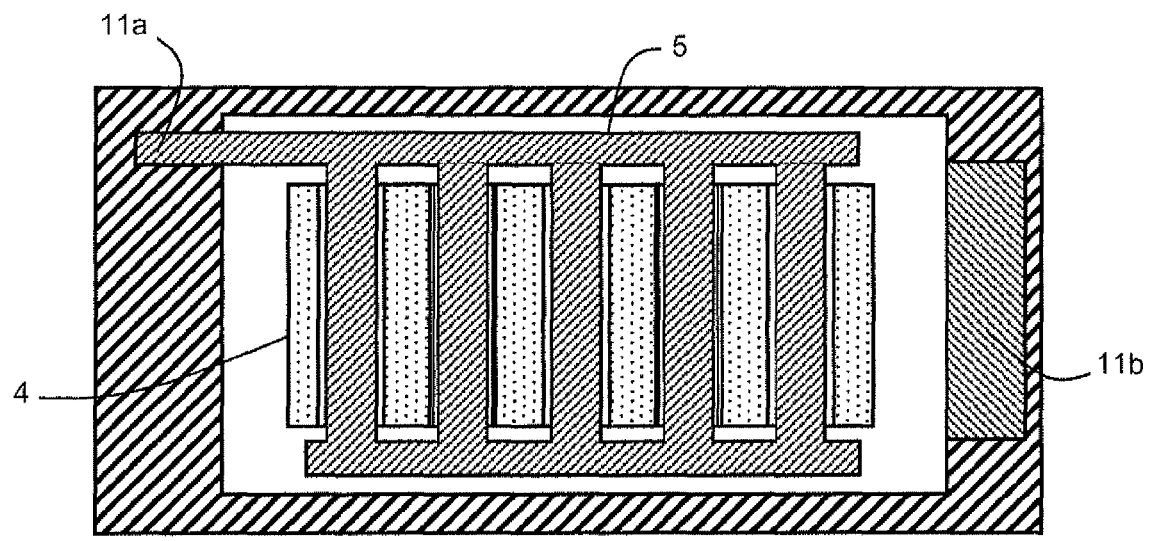
FIG. 7 shows, in a simplified cross-section view, the optoelectronic device of FIG. 6, FIG. 8 schematically shows an embodiment of an optoelectronic device with a three-dimensional effect according to the present invention, and FIG. 9 schematically shows three shapes of embedded electrode according to the invention.

FIGS. 6 and 7 show in respective front and top cross-section views an exemplary embodiment of an optoelectronic component. Upper electrode 5 is grid-shaped. Grid 5 comprises metal tracks preferably arranged to be parallel, at regular intervals, above electrode 2.

This grid aims at making the electron transport in organic layer 4 uniform, which increases the OLED light power.

It can be seen, in FIG. 6, that each track is electrically insulated from electrode 2 by separation area 8 and is covered with SAM layer 7. Organic layer 4 covers all the metal tracks and takes up the space between two successive tracks. An encapsulation layer 9 fully surrounds organic material 4 and protects it from the environment, and in particular from air and humidity.

In FIG. 7, the device comprises a contact area 11a of electrode 5 and a contact area 11b of electrode 2 ensuring the electric connection of the device to an external circuit.

Figure 8:
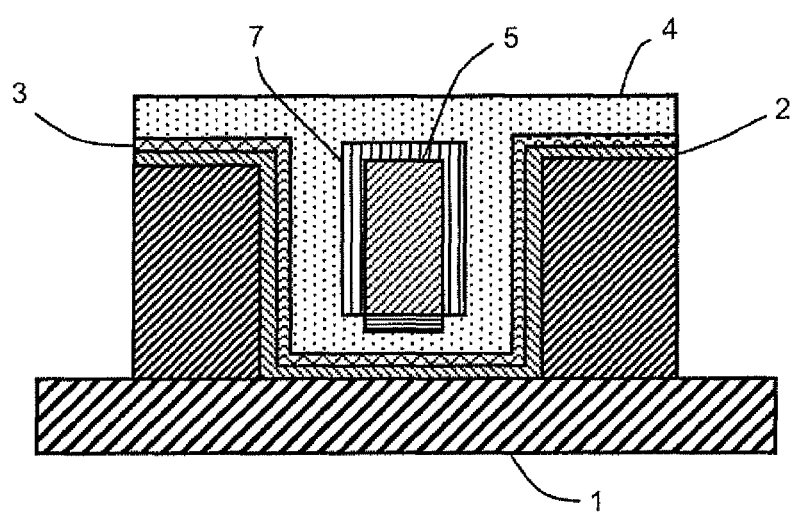

FIG. 8 shows a specific embodiment of an optoelectronic device having a three-dimensional effect. Unlike the planar configuration of FIGS. 3 to 7, electrode 2 is bowl-shaped. Electrode 5 covered with the SAM is placed inside of the bowl formed by electrode 2 and filled with organic material 4. Thus, the lateral surfaces of electrode 5 face the sides of bowl 2 while the lower surface of electrode 5 faces the bottom of the bowl. With this configuration, organic layer 4 takes a greater part in the photons generation, which increases the efficiency of the OLED.

A method for producing the optoelectronic device of FIG. 3 is described herebelow.

In a first step, electrode 2 is formed on substrate 1. Electrode 2 preferably is an anode formed by physical vapor deposition (PVD) of ITO (Indium Tin Oxide) over the entire substrate. Electrode 2 is then structured on substrate 1, for example, by photolithography.

Substrate 1, which is transparent to the radiation emitted by the OLED, is for example made of glass or of plastic to make the device flexible.

Electrode 2 may be covered with a charge injection and transport layer 3 to improve the electric conduction. Layer 3 is for example made from PEDOT:PSS in the case of a hole injection, from ZnO or TiO2 in the case of an electron injection, or in the form of a SAM layer adapted to the electrode function. Layer 3 is preferably formed by spin coating. It is then dried at 150° C. for 10 minutes, for example.

The next step consists of forming electrode separation layer 8 on layer 3. The formation of layer 8 for example comprises the deposition in the form of islands or in the form of a grid of an electrically insulating layer (FIGS. 3 and 6). Layer 8 is preferably deposited by inkjet printing.

According to a variant, the formation of layer 8 may comprise the deposition of a semiconductor material, alone (FIG. 4) or prior to the deposition of the insulating layer (FIG. 5). Such a full-plate deposition is preferably performed by spin coating.

Then, electrode 5 is formed on separation layer 8. This step may be carried out by PVD through a stencil mask. Electrode 5 has at least one lateral surface distant from an edge of the device. Electrode 5 is for example made of gold, silver, palladium, nickel, or copper and has a thickness ranging between 10 nm and 100 μm.

SAM layer 7 is then deposited on the (lateral and upper) free surfaces of electrode 5. The SAM layer is preferably deposited over the entire free surface of the electrode by immersion of the substrate in a solution of 4-methoxy-benzenethiol in ethanol, for example, for a gold cathode. Other SAM types may be used according to the nature of the electrode material, for example, decanethiol or 4-methylbenzenethiol for the cathode, or SAMs of pentafluoro-benzenthiol or perfluorodecanethiol type for the anode.

In an alternative embodiment, insulating layer 8 may be deposited over the entire substrate. Then, electrode 5 and SAM 7 are formed. During these steps, layer 8 behaves as a layer for protecting the already-formed lower layers. Then, the entire layer 8 is suppressed, except for the portion located under electrode 5. Electrode 5 may besides behave as a mask during this removal.

The next step consists of depositing organic material layer 4 on the surface of electrode 5 covered with a SAM and the free surface of layer 3. The organic material then forms an electric contact with electrode 2 via layer 3 and with electrode 5 via SAM layer 7. This deposition is performed under a controlled atmosphere, in a glove box for example.

Organic material 4 may be based on small molecules or of oligomers, generally deposited by vacuum evaporation. It may also be formed of a semiconductor polymer, for example, poly[p-phenylene vinylene] (PPV). The polymer layer is preferably formed by spin coating or by spraying, over a thickness ranging from 10 nm to 1 μm.

Finally, the encapsulation of the organic layer is for example performed by gluing a glass plate by means of a epoxy glue polymerizable by ultra-violet rays. Other techniques may be used but will not be detailed in the present application since they are conventional.

The architectures described in relation with FIGS. 3 to 8 enable both to easily integrate the SAM layer on the upper electrode, and to provide an intimate contact between the SAM layer and the organic layer, due to the fact that the organic material deposition is performed after the formation of the electrode and of the SAM layer. The electric contact and the current injection are thereby greatly improved.

In the embodiments of FIGS. 3, 5 to 8, electrically insulating layer 8 or 8b enables to use deposition techniques at higher energy than in prior art. Electrode 5 may be deposited on this insulating layer, by a PVD-type deposition, for example, with no risk of alteration of lower layers. Thus, organic material 8a arranged under insulating layer 8b is protected in the example of FIG. 5. Defects in the organic layer, causing leakage currents and short-circuits, are avoided.

Further, the upper electrode may now be formed by means of a photolithography due to this protection layer. Indeed, insulating layer 8b protects organic layer 8a from the deposition and the removal of resin used as a mask for the deposition of electrode 5. Thus, the spatial resolution of the upper electrode may be increased. This electrode may also be formed by laser ablation.

In addition, the deposition of the organic material, generally sensitive to air, may be postponed to the end of the process, requiring a single step in a glove box, and not the entire process. The producing method is thus considerably simplified.

Electrode 5 shown in FIGS. 3 to 8 has a rectangular cross-section. In FIG. 7, the metal tracks forming grid 5 are cuboids. However, other electrode shapes may be envisaged to increase the injection surface area of the upper electrode and thus increase the device efficiency.

Figure 9:
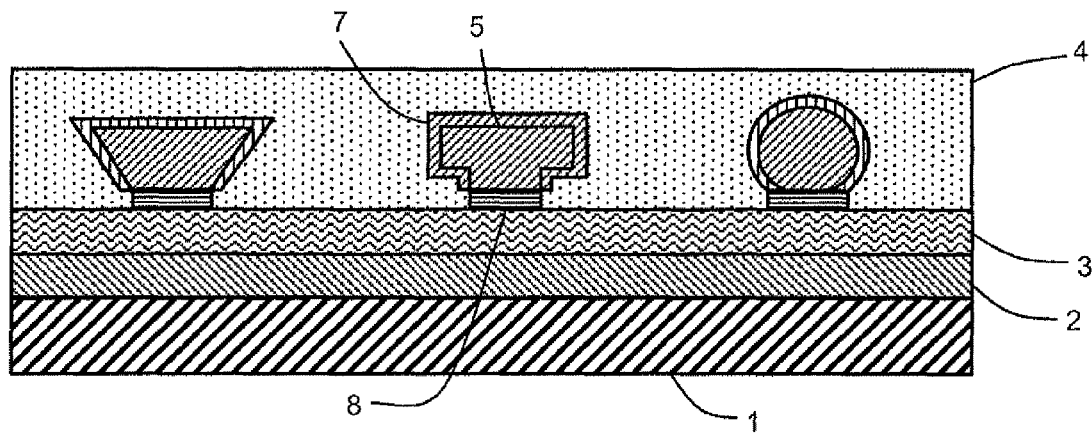

FIG. 9 shows several examples of electrode shape. Electrode 5 may have a trapezoidal cross-section (to the left in the drawing), a polygonal cross-section (at the center), or a circular cross-section (to the right in the drawing).

Numerous variants, modifications, and improvements of the optoelectronic device described herein will occur to those skilled in the art. The device operation has been described in relation with an OLED. However, the invention is not limited to a specific type of optoelectronic device, be it organic or inorganic.

In particular, the material of layer 4 may be an inorganic semiconductor. Indeed, the charge carrier injection problem also arises in the case of an inorganic semiconductor. The SAM layer will thus be used in the same way to make the work function of the metal closer to the conduction band of the semiconductor material.

Similarly, the device has been described with a cathode as an upper electrode. It may also be envisaged to use an anode with a work function which will be modulated to be made closer to the HOMO energy level of the organic material (or to the valence band of the inorganic material) and the device will then be said to have a "reverse structure". Finally, the two electrodes may comprise a self-assembled monolayer in contact with the organic material. The SAM layer associated with the lower electrode then behaves as an injection layer.

The invention claimed is:

1. An optoelectronic device comprising:
   a substrate,
   a first electrode arranged on the substrate,
   a second electrode comprising a first surface facing the first electrode, and a side wall adjacent to the first surface,
   an electrically insulating layer covering the first surface of the second electrode, and
   a layer of a semiconductor material in electric contact with the first electrode and the electrically insulating layer and covering the side wall of the second electrode by the insertion of a self-assembled monolayer.

2. The device according to claim 1, wherein the semiconductor material layer comprises two sub-layers made from different semiconductor materials.

3. The device according to claim 1, wherein the second electrode comprises a second surface, opposite to the first surface, covered with the semiconductor material layer by the insertion of the self-assembled monolayer.

4. The device according to claim 1, wherein the first electrode is provided with a charge injection layer.

5. The device according to claim 1, wherein the semiconductor material layer is an organic material.

6. A method for producing an optoelectronic device comprising the steps of:
   providing a first electrode arranged on a substrate,
   forming a separation layer, so that the separation layer comprises a semiconductor material layer,
   forming a second electrode on the separation layer, so that the second electrode has a side wall which is offset from an edge of the device,
   depositing a self-assembled monolayer on the side wall of the second electrode, and
   depositing a semiconductor material in contact with the first electrode and the self-assembled monolayer.

7. The method according to claim 6, wherein the self-assembled monolayer and the semiconductor material are deposited over the entire second electrode.

8. The method according to claim 6, wherein forming the separation layer comprises depositing an electrically insulating material.

9. An optoelectronic device comprising:
   a substrate,
   a first electrode arranged on the substrate,
   a second electrode comprising a first surface facing the first electrode, and a side wall adjacent to the first surface, and
   a layer of a semiconductor material in electric contact with the first and second electrodes and covering the side wall of the second electrode by the insertion of a self-assembled monolayer, the semiconductor material layer comprising two sub-layers made from different semiconductor materials.

10. The device according to claim 9, wherein the first surface is covered with an electrically insulating layer.

11. The device according to claim 10, wherein the electrically insulating layer is in contact with the first electrode.

12. The device according to claim 10, wherein the electrically insulating layer is separated from the first electrode by a semiconductor material layer.

13. The device according to claim 9, wherein the second electrode comprises a second surface, opposite to the first surface, covered with the semiconductor material layer by the insertion of the self-assembled monolayer.

14. The device according to claim 9, wherein the first electrode is provided with a charge injection layer.

15. The device according to claim 9, wherein the semiconductor material layer is an organic material.

16. A method for producing an optoelectronic device comprising the steps of:
   providing a first electrode arranged on a substrate,
   forming a separation layer,
   forming a second electrode on the separation layer, so that the second electrode has a side wall which is offset from an edge of the device,
   depositing a self-assembled monolayer on the side wall of the second electrode, and
   depositing a first semiconductor material in contact with the first electrode and the self-assembled monolayer, the semiconductor material layer comprising two sub-layers made from different semiconductor materials.

17. The method according to claim 16, wherein the self-assembled monolayer and the semiconductor material are deposited over the entire second electrode.

18. The method according to claim 16, wherein forming the separation layer comprises depositing a semiconductor material layer.

19. The method according to claim 16, wherein forming the separation layer comprises depositing an electrically insulating material.

* * * * *